(12) United States Patent
Nishida et al.

(10) Patent No.: US 7,665,208 B2
(45) Date of Patent: Feb. 23, 2010

(54) THROUGH HOLE FORMING METHOD

(75) Inventors: Kanji Nishida, Ibaraki (JP); Naoyuki Matsuo, Ibaraki (JP); Masakatsu Urairi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 265 days.

(21) Appl. No.: 11/766,129

(22) Filed: Jun. 21, 2007

(65) Prior Publication Data
US 2008/0005898 A1    Jan. 10, 2008

(30) Foreign Application Priority Data
Jul. 4, 2006    (JP) .............................. 2006-183994

(51) Int. Cl.
*H01K 3/10* (2006.01)
*B05D 5/12* (2006.01)

(52) U.S. Cl. .............................. 29/852; 29/825; 29/846; 427/97.2; 427/97.7

(58) Field of Classification Search ................... 29/825, 29/832, 846, 852; 427/97.2, 97.7
See application file for complete search history.

(56) References Cited

FOREIGN PATENT DOCUMENTS

| | | | |
|---|---|---|---|
| JP | 2003204137 A | * | 7/2003 |
| JP | 2005-072324 A | | 3/2005 |
| JP | 2006026665 A | * | 2/2006 |

* cited by examiner

*Primary Examiner*—C. J Arbes
(74) *Attorney, Agent, or Firm*—Panitch Schwarze Belisario & Nadel LLP

(57) ABSTRACT

A first through hole is formed in a laminate by trepanning machining using laser light, for example. The trepanning machining refers to a process for irradiating laser light along such a trajectory that the laser light is first irradiated onto a substantially central area of a first through hole to be formed, the laser light is irradiated along a circumference corresponding to the bore diameter of the first through hole to be formed, and the laser light is finally irradiated onto the substantially central area of the first through hole to be formed again. A second through hole being substantially concentric with and having a larger bore diameter than the first through hole is formed by irradiating the laser light, similarly to the first through hole.

12 Claims, 6 Drawing Sheets

F I G. 1
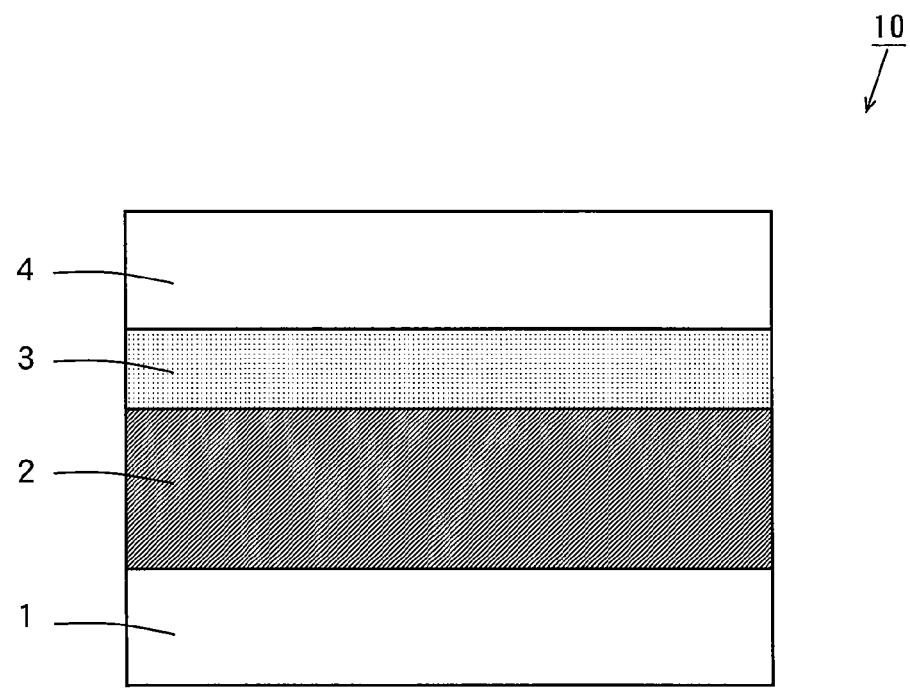

F I G. 5
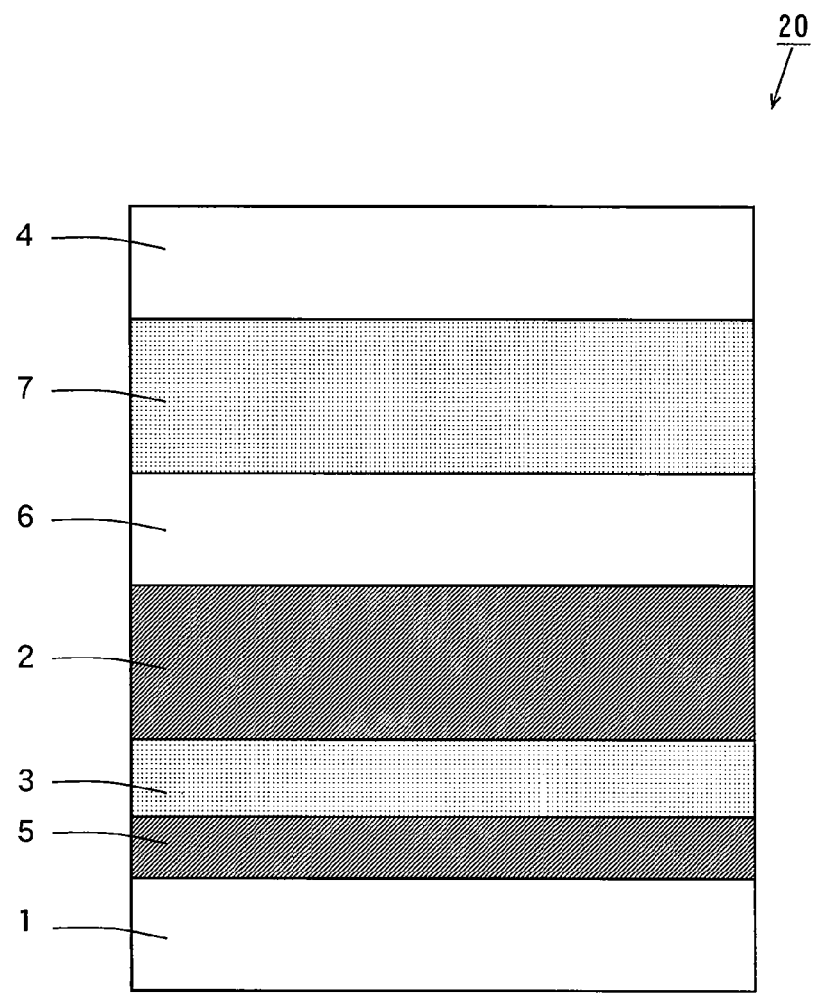

THROUGH HOLE FORMING METHOD

BACKGROUND OF THE INVENTION

1. Field of the Invention

The present invention relates to a through hole forming method for forming a though hole in a conductor laminated plate having a laminated structure of a conductor layer and an insulating layer, and a printed circuit board manufacturing method including the through hole forming method.

2. Description of the Background Art

Conventionally, printed circuit boards have been used for various types of electric equipment or electronic equipment. The printed circuit boards generally have laminated structures of insulating layers composed of polyamide and conductor layers composed of a copper foil, for example, formed on both surfaces of the insulating layers. The insulating layers and the conductor layers may, in some cases, be made to adhere to each other by adhesive layers. The conductor layers are subjected to etching, to have predetermined patterned conductors.

When such printed circuit boards are manufactured, a copper laminated plate having the above-mentioned laminated structure, for example, is used. The copper laminated plate is obtained by previously laminating a plurality of conductor layers composed of a copper foil or the like on an insulating layer composed of polyamide or the like using an adhesive layer.

The copper laminated plate is provided with a through hole for electrically connecting the plurality of conductor layers. The through hole is formed by irradiating laser light onto the copper laminated plate. After the through hole is thus formed, a metal thin film (an electroless plating layer and an electrolytic plating layer) for electrically connecting conductor layers are formed on a surface of the through hole (see JP 2005-072324 A, for example).

When the laser light is irradiated in order to form the through hole in the copper laminated plate, as described above, however, a surface of the adhesive layer on an inner wall of the through hole that is being formed is gouged with heat energy generated within the through hole, to have a concave (or convex) shape. As a result, the metal thin film is disconnected in forming the metal thin film, so that electrical connection reliability is degraded.

SUMMARY OF THE INVENTION

An object of the present invention is to provide a through hole forming method in which a through hole can be formed while an adhesive layer is prevented from being gouged.

Another object of the present invention is to provide a printed circuit board manufacturing method in which electrical connection reliability can be prevented from being degraded.

According to an aspect of the present invention, a through hole forming method for forming a through hole in a conductor laminated plate obtained by laminating a conductor layer and an insulating layer with an adhesive layer sandwiched therebetween includes the steps of forming a first through hole in the conductor laminated plate, and removing an inner peripheral wall of the first through hole with laser light, to form a second through hole being substantially concentric with and having a larger diameter than the first through hole.

In the through hole forming method, the first through hole is formed in the conductor laminated plate obtained by laminating the conductor layer and the insulating layer with the adhesive layer sandwiched therebetween. The inner peripheral wall of the formed first through hole is removed with the laser light, to form the second through hole being substantially concentric with and having a larger diameter than the first through hole.

When the first through hole is thus formed, and the second through hole being substantially concentric with and having a larger diameter than the first through hole is then formed, heat energy generated by the laser light is diffused into an air layer inside the first through hole. This makes it difficult for the heat energy to be absorbed by the adhesive layer on an inner wall of the second through hole, which inhibits the adhesive layer on the inner wall of the second through hole from being gouged. Consequently, it is possible to satisfactorily form the second through hole.

The step of forming the first through hole may comprise the step of irradiating the laser light onto the conductor laminated plate, to form the first through hole. In this case, after the first through hole is formed with the laser light, the second through hole can be continuously formed with the laser light.

The conductor laminated plate may include a plurality of the conductor layers. In this case, a multilayer conductor laminated plate composed of the plurality of conductor layers is realized. In such a multilayer conductor laminated plate, it is also possible to form the through hole without preventing the adhesive layer from being gouged.

The insulating layer may include polyamide. In this case, the flexibility and the insulating properties of the insulating layer are ensured.

The adhesive layer may include at least one of acrylic adhesives, epoxy adhesives, and rubber adhesives. In this case, high adhesion between the insulating layer and the conductor layer is ensured.

The conductor layer may include a copper foil. In this case, the conductivity of the conductor layer is high, and patterning by etching becomes easy.

A printed circuit board manufacturing method according to another aspect of the present invention includes the steps of preparing a conductor laminated plate respectively having conductor layers on both surfaces of an insulating layer with at least one adhesive layer sandwiched therebetween, forming a through hole penetrating the conductor laminated plate, forming an electric conductor layer on an inner peripheral surface of the through hole and respective surfaces of the conductor layers, and processing the conductor layers, to form a patterned conductor, the step of forming the through hole including the steps of forming a first through hole in the conductor laminated plate, and removing an inner peripheral wall of the first through hole with laser light, to form a second through hole being substantially concentric with and having a larger diameter than the first through hole as the through hole.

In the printed circuit board manufacturing method, the conductor laminated plate having the conductor layers on both the surfaces of the insulating layer with the at least one adhesive layer sandwiched therebetween is first prepared. Then, the through hole penetrating the conductor laminated plate is formed. In this case, the first through hole is formed in the conductor laminated plate obtained by laminating the conductor layers and the insulating layer with the adhesive layer sandwiched therebetween. The inner peripheral wall of the formed first through hole is removed with the laser light, to form the second through hole being substantially concentric with and having a larger diameter than the first through hole as the through hole.

After the electric conductor layer is formed on the inner peripheral surface of the through hole and the surfaces of the conductor layers, the conductor layers are then processed, to form the patterned conductor.

When the first through hole is thus formed, and the second through hole being substantially concentric with and having a larger diameter than the first through hole is then formed, heat energy generated by the laser light is diffused into an air layer inside the first through hole. This makes it difficult for the heat energy to be absorbed by the adhesive layer on the inner wall of the second through hole, which inhibits the adhesive layer on the inner wall of the second through hole from being gouged. Consequently, it is possible to satisfactorily form the second through hole.

As a result, the electric conductor layer can be formed without being disconnected on the inner peripheral surface of the through hole satisfactorily formed and the surfaces of the conductor layers. Consequently, electric connection reliability can be prevented from being degraded.

The step of forming the first through hole may include the step of irradiating the laser light onto the conductor laminated plate, to form the first through hole. In this case, after the first through hole is formed with the laser light, the second through hole can be continuously formed with the laser light.

The conductor laminated plate may include a plurality of the conductor layers. In this case, a multilayer conductor laminated plate composed of the plurality of conductor layers is realized. In such a multilayer conductor laminated plate, it is also possible to form a through hole without preventing the adhesive layer from being gouged.

The insulating layer may include polyamide. In this case, the flexibility and the insulating properties of the insulating layer are ensured.

The adhesive layer may include at least one of acrylic adhesives, epoxy adhesives, and rubber adhesives. In this case, high adhesion between the insulating layer and the conductor layer is ensured.

The conductor layer may include a copper foil. In this case, the conductivity of the conductor layer is high, and patterning by etching becomes easy.

Other features, elements, characteristics, and advantages of the present invention will become more apparent from the following description of preferred embodiments of the present invention with reference to the attached drawings.

BRIEF DESCRIPTION OF THE DRAWINGS

FIG. 1 is a cross-sectional view showing an example of a laminate serving as a conductor laminated plate;

FIG. 5 is a cross-sectional view showing another example of a laminate; and

DESCRIPTION OF THE PREFERRED EMBODIMENTS

Figure 2:
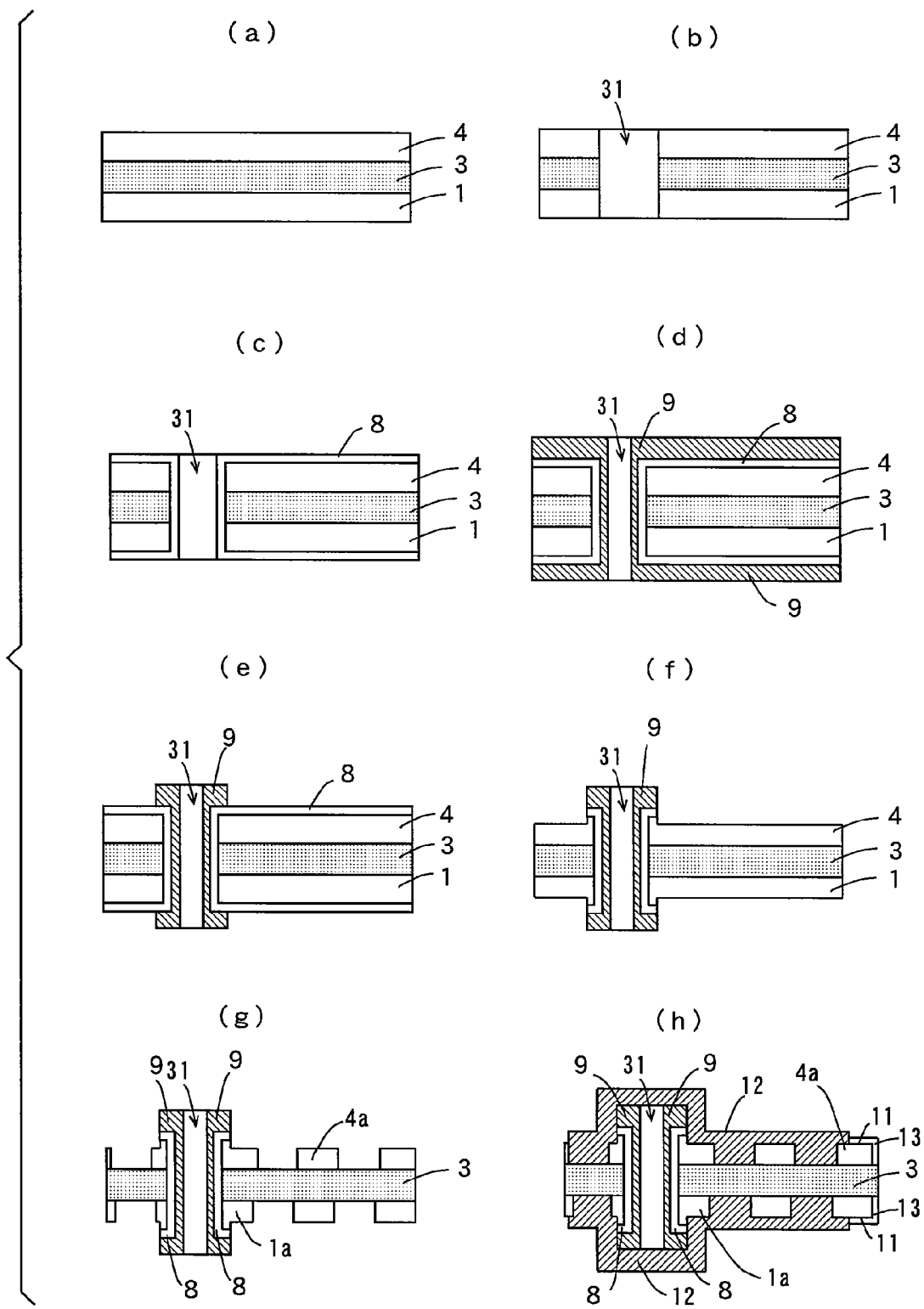
FIG. 2 is a schematic sectional view showing the steps of manufacturing a printed circuit board using the laminate shown in FIG. 1.

A through hole forming method and a printed circuit board manufacturing method according to the present invention will be now described while referring to the drawings.

(1) First Embodiment (1-1) Configuration of Conductor Laminated Plate

FIG. 1 is a cross-sectional view showing an example of a laminate serving as a conductor laminated plate.

As shown in FIG. 1, a laminate 10 has a first conductor layer 1 composed of a copper foil, for example, an adhesive layer 2, an insulating layer 3, and a second conductor layer 4 composed of a copper foil, for example, laminated therein in this order. A plate obtained by laminating a plurality of first and second conductor layers 1 and 4 composed of a copper foil on the insulating layer 3 using the adhesive layer 2 is referred to as a copper laminated plate.

Other examples of the first and second conductor layers 1 and 4 include nickel (Ni), gold (Au), and their alloys. In the present embodiment, a copper foil is used for the first and second conductor layers 1 and 4, as described above. It is preferable that the thickness of each of the first and second conductor layers 1 and 4 is 3 to 50 μm, for example.

Examples of the insulating layer 3 include polyamide resin, polyamide imide resin, acrylic resin, polyether nitrile resin, polyether sulphone resin, polyethylene terephthalate resin, and polyethylene naphthalate resin. It is preferable that polyamide resin is used in consideration of ensuring of good insulating properties and realization of low costs, for example. It is preferable that the thickness of each of the insulating layer 3 is 5 to 50 μm, for example.

Examples of the adhesive layer 2 include acrylic adhesives, epoxy adhesives, and rubber adhesives. It is preferable that the thickness of the adhesive layer 2 is 2 to 50 μm, for example.

(1-2) Printed Circuit Board Manufacturing Method

Here, a method of manufacturing a printed circuit board using the laminate 10 as the conductor laminated plate will be described while referring to the drawings.

FIG. 2 is a schematic sectional view showing the steps of manufacturing the printed circuit board using the laminate 10 shown in FIG. 1. In FIG. 2, the illustration of the adhesive layer 2 is omitted for simplification.

As shown in FIG. 2 (a), the laminate 10 shown in FIG. 1 is first prepared. As shown in FIG. 2 (b), a second through hole 31 penetrating the first conductor layer 1, the second conductor layer 4, and the insulating layer 3 is formed at a predetermined position.

In the present embodiment, a forming method having two steps of forming a first through hole 30, described later, and then forming a second through hole 31 being substantially concentric with and having a larger diameter than the first through hole 30 is used. The details of the method of forming the first through hole 30 and the second through hole 31 will be described.

An electric conductor layer is then formed on the insulating layer 3 and the first and second conductor layers 1 and 4. In the present embodiment, an electroless copper plating layer 8 is used as the electric conductor layer. Specifically, the insulating layer 3 and the first and second conductor layers 1 and 4 are dipped into a copper plating liquid after their respective surfaces are coated with a palladium catalyst. As shown in FIG. 2 (c), the electroless copper plating layer 8 is thus formed on an inner wall of the second through hole 31 and the surfaces of the first and second conductor layers 1 and 4. The first conductor layer 1 and the second conductor layer 4 are electrically connected to each other through the electroless copper plating layer 8. The thickness of the electroless copper plating layer 8 is 0.3 μm, for example.

Thereafter, as shown in FIG. 2 (*d*), the whole surface of the electroless copper plating layer 8 is subjected to electrolytic copper plating, to form an electrolytic copper plating layer 9. The thickness of the electrolytic copper plating layer 9 is not less than 5 μm nor more than 20 μm, for example.

As shown in FIG. 2 (*e*), an etching resist (not shown) is formed in the second through hole 31 and a peripheral portion (not shown) of the second through hole 31 to make etching, thereby removing the electrolytic copper plating layer 9 in an area excluding the second through hole 31 and the peripheral portion.

Furthermore, as shown in FIG. 2 (*f*), after the electrolytic copper plating layer 9 in the area is removed, the electroless copper plating layer 8 and the first and second conductor layers 1 and 4 in the area are etched, to reduce the thickness of each of the first and second conductor layers 1 and 4. The etching is soft etching using sodium persulfate, for example. The thickness of the conductor layer removed by the etching can be controlled by a temperature of and a time period for the etching or the concentration of an etchant (sodium persulfate).

After the first and second conductor layers 1 and 4 that are made thin by the etching are then subjected to washing processing using an acid, a photoresist (not shown) is formed on the surfaces of the first and second conductor layers 1 and 4, to pattern each of the first and second conductor layers 1 and 4 with a desired shape by an exposure process and a development process.

As shown in FIG. 2 (*g*), patterned conductors 1*a* and 4*a* are thus formed. The width of each of the patterned conductors 1*a* and 4*a* is 75 μm, for example, and a space therebetween is 75 μm, for example.

Furthermore, as shown in FIG. 2 (*h*), the patterned conductors 1*a* and 4*a*, the electroless copper plating layer 8, and the electrolytic copper plating layer 9 are coated with a coverlay 12 composed of polyamide resin with adhesives. The thickness of the coverlay 12 is 20 μm, for example. In this case, a contact portion 11 of the patterned conductor 4*a* is exposed.

Thereafter, the exposed contact portion 11 of the patterned conductor 4*a* is subjected to electrolytic nickel/gold plating, to form an electroless gold plating layer 13 thereon. Used as another printed circuit board manufacturing method may be an additive method (e.g., FIGS. 2 (*c*), 2 (*e*), 2 (*g*), and 2 (*h*) in this order).

(1-3) Through Hole Forming Method

A through hole forming method in which the second through hole 31 is formed in the laminate 10 will be then described while referring to the drawings.

Figure 3:
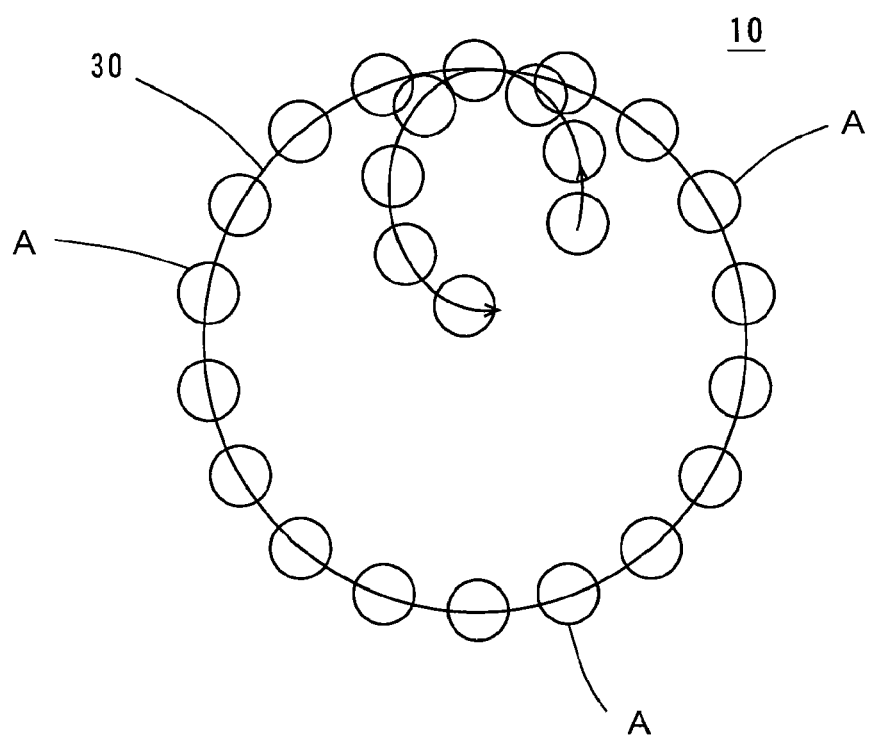
FIG. 3 is an explanatory view for explaining a through hole forming method in which a first through hole is formed in a laminate.

FIG. 3 is an explanatory view for explaining the through hole forming method in which the first through hole 30 is formed in the laminate 10.

As shown in FIG. 3, the first through hole 30 is formed in the laminate 10 using laser light, punching, or a drill, for example. After the first through hole 30 is formed, it is preferable that the laser light is used in continuously forming the second through hole 31, described later.

Here, in the present embodiment, trepanning machining can be used for forming the first through hole 30.

The trepanning machining refers to a process for irradiating laser light along such a trajectory that the laser light is first irradiated onto a substantially central area of a first through hole 30 to be formed, the laser light is irradiated along a circumference corresponding to the bore diameter of the first through hole 30 to be formed, and the laser light is finally irradiated onto the substantially central area of the first through hole 30 to be formed again in FIG. 3. In FIG. 3, an area A onto which the laser light is irradiated once is illustrated along an irradiation trajectory of the laser light.

It is preferable that the bore diameter of the first through hole 30 is approximately two times the diameter of the laser light, for example.

Although the first through hole 30 may be formed so as to have a desired bore diameter by being processed once with the laser light, it may be formed by being processed two or more times with the laser light.

The first through hole 30 is thus formed by being processed twice, for example, with the laser light, which can inhibit the adhesive layer 2 on an inner wall of the first through hole 30 from being gouged with heat energy generated by the laser light.

In the present embodiment, after the first through hole 30 is formed, and the second through hole 31, described later, is then formed.

Figure 4:
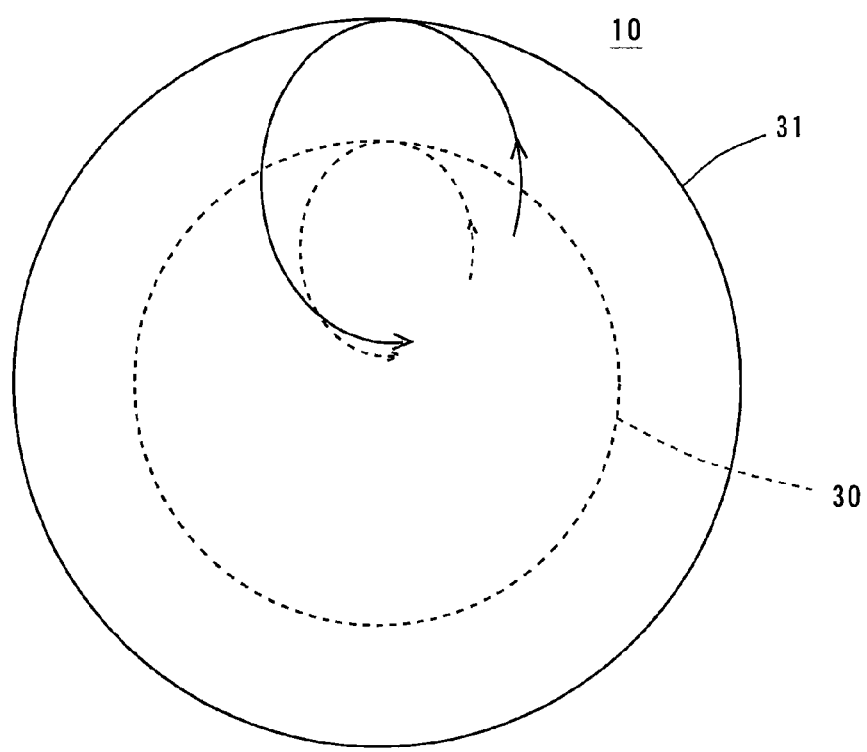
FIG. 4 is an explanatory view for explaining a through hole forming method in which a second through hole is formed in a laminate.

FIG. 4 is an explanatory view for explaining a through hole forming method in which the second through hole 31 is formed in the laminate 10.

As shown in FIG. 4, the second through hole 31 being substantially concentric with and having a larger bore diameter than the first through hole 30 is formed by irradiating laser light, similarly to the first through hole 30.

When the second through hole 31 is thus formed, the heat energy generated by the laser light is diffused into an air layer inside the first through hole 30, which makes it difficult for the heat energy to be absorbed by the adhesive layer 2 on an inner wall of the second through hole 31.

(2) Second Embodiment

FIG. 5 is a cross-sectional view showing another example of a laminate.

As shown in FIG. 5, a laminate 20 has a first conductor layer 1 composed of a copper foil, for example, a second adhesive layer 5, a first insulating layer 3, a first adhesive layer 2, a third conductor layer 6 composed of a copper foil, for example, a second insulating layer 7, and a second conductor layer 4 composed of a copper foil, for example, laminated therein in this order.

The second adhesive layer 5 is composed of the same material as the first adhesive layer 2, and the thickness thereof is 10 μm, for example.

Another example of the third conductor layer 6 is the same as respective other examples of the first and second conductor layers 1 and 4. The thickness of the third conductor layer 6 is the same as the thickness of each of the first and second conductor layers 1 and 4.

The second insulating layer 7 is made of the same material and has the same thickness as the first insulating layer 3.

In the laminate 20 according to the second embodiment, the same through hole forming method and printed circuit board manufacturing method as those according to the first embodiment are also used.

(3) Effects of First and Second Embodiments

In the above-mentioned embodiments, when the first through hole 30 is formed, and the second through hole 31 being substantially concentric with and having a larger diameter than the first through hole 30 is then formed, the heat energy generated by the laser light is diffused into the air layer inside the first through hole 30. This makes it difficult for the heat energy to be absorbed by each of the adhesive layers on the inner wall of the second through hole 31, which inhibits the adhesive layer on the inner wall of the second through hole 31 from being gouged. Therefore, it is possible to satisfactorily form the second through hole 31.

As described in the foregoing, the electroless copper plating layer 8 and the electrolytic copper plating layer 9 can be formed without being disconnected on the inner wall of the second through hole 31. Consequently, electrical connection reliability is prevented from being degraded.

In the foregoing embodiments, the first through hole 30 is formed by being processed twice with the laser light, which allows the amount of the adhesive layer 2 gouged with the heat energy generated by the laser light to be reduced on the inner wall of the first through hole 30. When the second through hole 31 is formed, therefore, the above-mentioned amount is further reduced.

(4) Another Embodiment

The configuration of each of the layers composing the laminates 10 and 20 in the first and second embodiments is not limited to the same. For example, an adhesive layer may be provided between the insulating layer 3 and the second conductor 4 in FIG. 1. Alternatively, an adhesive layer may be provided between the third conductor layer 6 and the second insulating layer 7 in FIG. 5.

(5) Correspondences Between Elements in Claims and Units in Embodiments

In the following paragraphs, non-limiting examples of correspondences between various elements recited in the claims below and those described above with respect to various preferred embodiments of the present invention are explained.

In the embodiments described above, the laminates 10 and 20 are examples of a conductor laminated plate, and the electroless copper plating layer 8 is an example of an electric conductor layer.

As each of constituent elements in the claims, various other elements having the configuration or the function described in the claims can be also used.

INVENTIVE EXAMPLES

The through hole forming methods according to inventive examples of the present invention will be now described while referring to the drawings.

(a) Inventive Example 1

Figure 6:
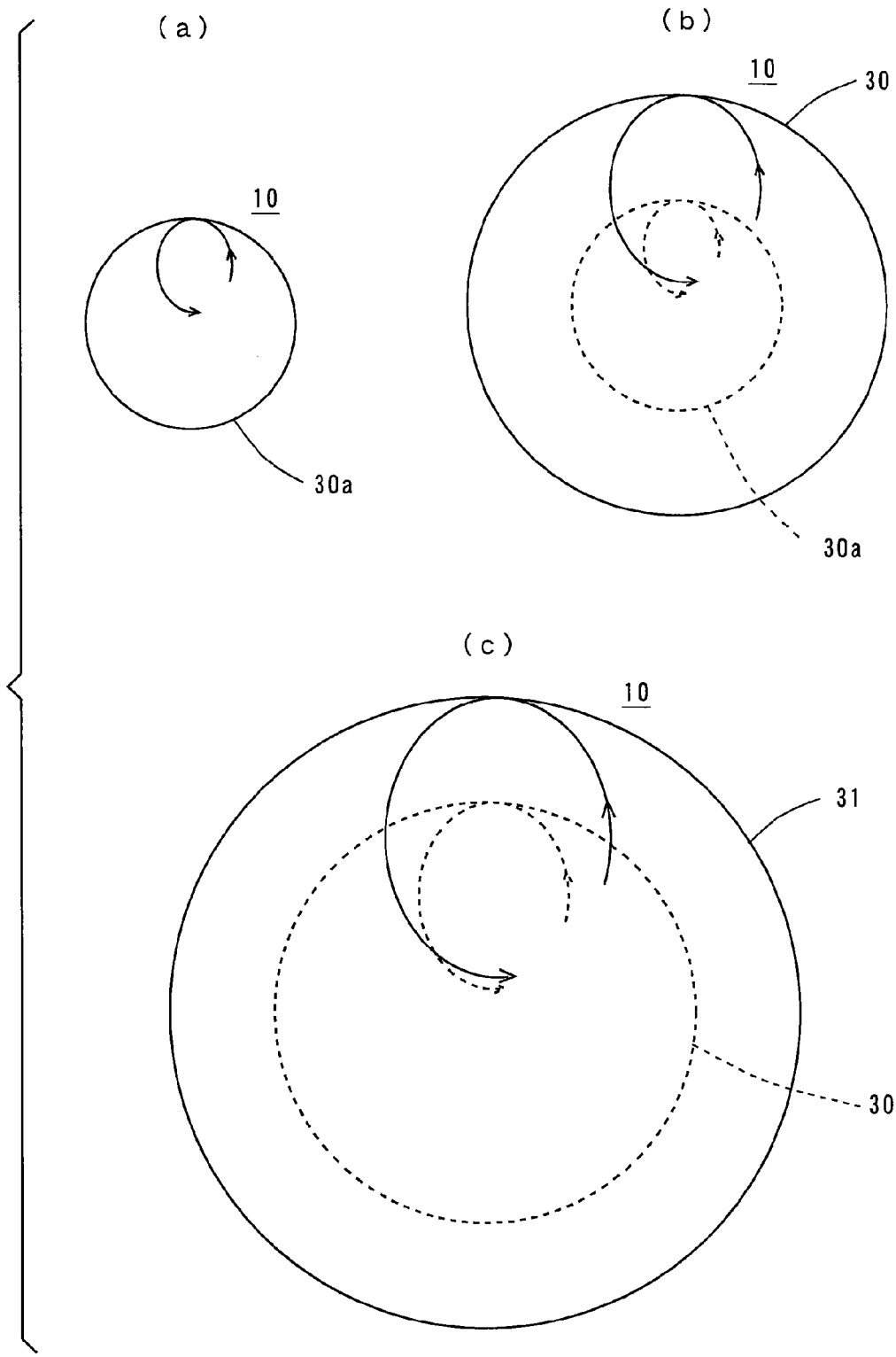
FIG. 6 is an explanatory view showing a sequence in a through hole forming method in an inventive example 1.

FIG. 6 is an explanatory view showing a sequence in a through hole forming method in an inventive example 1.

In this inventive example, the laminate 10 (see FIG. 1) according to the first embodiment was prepared. In the laminate 10, the thickness of the first conductor layer 1, the thickness of the adhesive layer 2, the thickness of the insulating layer 3, and the thickness of the second conductor layer 4 were respectively set to 18 µm, 25 µm, 12.5 µm, and 18 µm.

As shown in FIG. 6 (*a*), laser light was first irradiated onto the laminate 10 using the trepanning machining before the first through hole 30 was formed, to form a through hole 30*a* having a bore diameter of 50 µm.

As shown in FIG. 6 (*b*), the laser light was then irradiated onto an inner wall of the through hole 30*a* using the trepanning machining, to form a first through hole 30 having a bore diameter of 100 µm.

As shown in FIG. 6 (*c*), the laser light was then irradiated onto an inner wall of the first through hole 30 using the trepanning machining, to remove an area having a bore diameter of 25 µm in a radial direction. Thus, a second through hole 31 having a bore diameter of 150 µm was formed in the laminate 10.

Note that the conditions of the process with the laser light in forming the first through hole 30 and the second through hole 31 were as follows.

Used as a light source was a YAG (Yttrium-Aluminum Garnet) laser including neodymium (Nd) excited by a semiconductor laser. The wavelength of the laser light was set to 355 nm, the diameter of the laser light was set to 25 µm, an output was set to 4.2 W, and the movement speed of irradiation of the laser light was set to 250 mm/seconds.

(b) Inventive Example 2

In this inventive example, the laminate 20 (see FIG. 5) according to the second embodiment was prepared. In the laminate 20, the thickness of the first conductor layer 1, the thickness of the second adhesive layer 5, the thickness of the first insulating layer 3, the thickness of the first adhesive layer 2, the thickness of the third conductor layer 6, the thickness of the second insulating layer 7, and the thickness of the second conductor layer 4 were respectively set to 18 µm, 10 µm, 12.5 µm, 25 µm, 18 µm, 25 µm, and 18 µm.

A second through hole 31 having a bore diameter 150 µm was then formed in the laminate 20, as in the inventive example 1.

(c) Comparative Example 1

In this comparative example, the laminate 10 (see FIG. 1) according to the first embodiment was prepared. A through hole having a bore diameter of 150 µm was formed in the laminate 10 by carrying out the trepanning machining once.

(d) Comparative Example 2

In this comparative example, the laminate 20 (see FIG. 5) according to the second embodiment was prepared. A through hole having a bore diameter of 150 µm was formed in the laminate 20 by carrying out the trepanning machining once.

(e) Evaluation of Inventive Examples and Comparative Examples

In the adhesive layers 2 in the laminate 10 in the inventive example 1 and the comparative example 1, the depths of the portions gouged with the heat energy generated by the laser light were measured. The results of the measurements were respectively 13.7 µm and 14.6 µm. The first conductor layers 1 on the inner walls of the second through holes 31 were used as the basis for measuring the depths.

In the first and second adhesive layers 2 and 5 in the laminates 20 in the inventive example 2 and the comparative example 2, the depths of the portions gouged with the heat energy generated by the laser light were measured. The results of the measurements were respectively 4.6 µm and 9.8 µm. The average values of the respective depths in the first adhesive layer 2 and the second adhesive layer 5 were calculated as the results of the measurements.

As can be seen from the foregoing results, forming the second through hole 31 in two steps can inhibit each of the adhesive layers on the inner wall of the second through hole 31 from being gouged.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A through hole forming method for forming a through hole in a conductor laminated plate obtained by laminating a conductor layer and an insulating layer with an adhesive layer sandwiched therebetween, comprising the steps of:
   forming a first through hole having a first diameter in said conductor laminated plate; and
   moving a laser light in a trajectory which begins in a substantially central area of the first through hole, then the trajectory continues through part of a circle with a second diameter larger than said first diameter, and then the trajectory returns to said central area, to enlarge said first through hole and thus form a second through hole having the second diameter.

2. The through hole forming method according to claim 1, wherein said step of forming the first through hole includes the step of irradiating the laser light onto said conductor laminated plate, to form said first through hole.

3. The through hole forming method according to claim 1, wherein said conductor laminated plate includes a plurality of said conductor layers.

4. The through hole forming method according to claim 1, wherein said insulating layer includes polyimide.

5. The through hole forming method according to claim 1, wherein said adhesive layer includes at least one adhesive selected from the group consisting of acrylic adhesives, epoxy adhesives, and rubber adhesives.

6. The through hole forming method according to claim 1, wherein said conductor layer comprises a copper foil.

7. A printed circuit board manufacturing method, comprising the steps of:
   preparing a conductor laminated plate respectively having first conductor layers facing first and second surfaces of an insulating layer with at least one adhesive layer sandwiched therebetween;
   forming a through hole penetrating said conductor laminated plate;
   forming a second conductor layer on an inner peripheral surface of said through hole and respective surfaces of said first conductor layers; and
   processing said first conductor layers, to form a patterned conductor,
   said step of forming the through hole including the steps of
   forming a first through hole having a first diameter in said conductor laminated plate, and
   moving a laser light in a trajectory which begins in a substantially central area of the first through hole, then the trajectory continues through part of a circle with a second diameter larger than said first diameter, and then the trajectory returns to said central area, to enlarge said first through hole and thus form a second through hole having the second diameter.

8. The printed circuit board manufacturing method according to claim 7, wherein said step of forming the first through hole includes the step of irradiating the laser light onto said conductor laminated plate, to form said first through hole.

9. The printed circuit board manufacturing method according to claim 7, wherein said conductor laminated plate includes a plurality of said first conductor layers.

10. The printed circuit board manufacturing method according to claim 7, wherein said insulating layer includes polyimide.

11. The printed circuit board manufacturing method according to claim 7, wherein said adhesive layer includes at least one adhesive selected from the group consisting of acrylic adhesives, epoxy adhesives, and rubber adhesives.

12. The printed circuit board manufacturing method according to claim 7, wherein one of said first conductor layers comprises a copper foil.

* * * * *